United States Patent
Finkenzeller et al.

(10) Patent No.: US 10,084,461 B2
(45) Date of Patent: Sep. 25, 2018

(54) METHOD AND SECURITY MODULE FOR RECEIVING TWO SIGNALS

(71) Applicant: GIESECKE & DEVRIENT GMBH, München (DE)

(72) Inventors: Klaus Finkenzeller, Unterföhring (DE); Florian Pfeiffer, Grafing bei München (DE)

(73) Assignee: GIESECKE+DEVRIENT MOBILE SECURITY GMBH, Munich (DE)

( * ) Notice: Subject to any disclaimer, the term of this patent is extended or adjusted under 35 U.S.C. 154(b) by 0 days.

(21) Appl. No.: 15/514,211

(22) PCT Filed: Sep. 22, 2015

(86) PCT No.: PCT/EP2015/001881
§ 371 (c)(1),
(2) Date: Mar. 24, 2017

(87) PCT Pub. No.: WO2016/045787
PCT Pub. Date: Mar. 31, 2016

(65) Prior Publication Data
US 2017/0294916 A1    Oct. 12, 2017

(30) Foreign Application Priority Data
Sep. 26, 2014 (DE) .......................... 10 2014 014 448

(51) Int. Cl.
*H04B 1/10* (2006.01)
*H03L 7/093* (2006.01)
(Continued)

(52) U.S. Cl.
CPC ............... *H03L 7/093* (2013.01); *H03D 1/02* (2013.01); *H03L 7/097* (2013.01)

(58) Field of Classification Search
CPC ........ H04B 1/24; H04B 1/109; G06K 7/0008; G06K 19/0723; H03L 7/093; H03L 7/097; H03D 1/02
(Continued)

(56) References Cited

U.S. PATENT DOCUMENTS

2005/0164665 A1    7/2005  Suganuma
2006/0109128 A1*   5/2006  Barink ................. G06K 7/0008
                                                  340/572.2
(Continued)

OTHER PUBLICATIONS

German Search Report for corresponding German Application No. 102014014448.8, dated May 20, 2015.
(Continued)

*Primary Examiner* — Lee Nguyen
(74) *Attorney, Agent, or Firm* — Workman Nydegger

(57) ABSTRACT

A method for producing an output bit stream for a first signal of a first carrier frequency by a security module involves the security module receiving an input signal comprising the first signal and a second signal of a second carrier frequency. A mixed signal is formed which has the first signal at the first carrier frequency, the second signal at the second carrier frequency, and a mixed product at an intermediate frequency. The mixed product is demodulated by a second nonlinear component to output a second baseband signal for generating a second bit stream relating to the first signal in the mixed product. The output logic produces the output bit stream for the first signal, and selects either the first bit stream or the second bit stream as the output bit stream for the first signal.

15 Claims, 8 Drawing Sheets

(51) Int. Cl.
*H03L 7/097* (2006.01)
*H03D 1/02* (2006.01)
*H04B 1/26* (2006.01)

(58) Field of Classification Search
USPC .................................. 455/295–296, 302–303
See application file for complete search history.

(56) References Cited

U.S. PATENT DOCUMENTS

| | | |
|---|---|---|
| 2006/0273902 A1 | 12/2006 | Shafer et al. |
| 2009/0036082 A1 | 2/2009 | Sajid et al. |
| 2014/0266622 A1 | 9/2014 | Alicot et al. |
| 2014/0273899 A1 | 9/2014 | Dokai et al. |

OTHER PUBLICATIONS

International Search Report for corresponding International PCT Application No. PCT/EP2015/001881, dated Dec. 9, 2015.

* cited by examiner

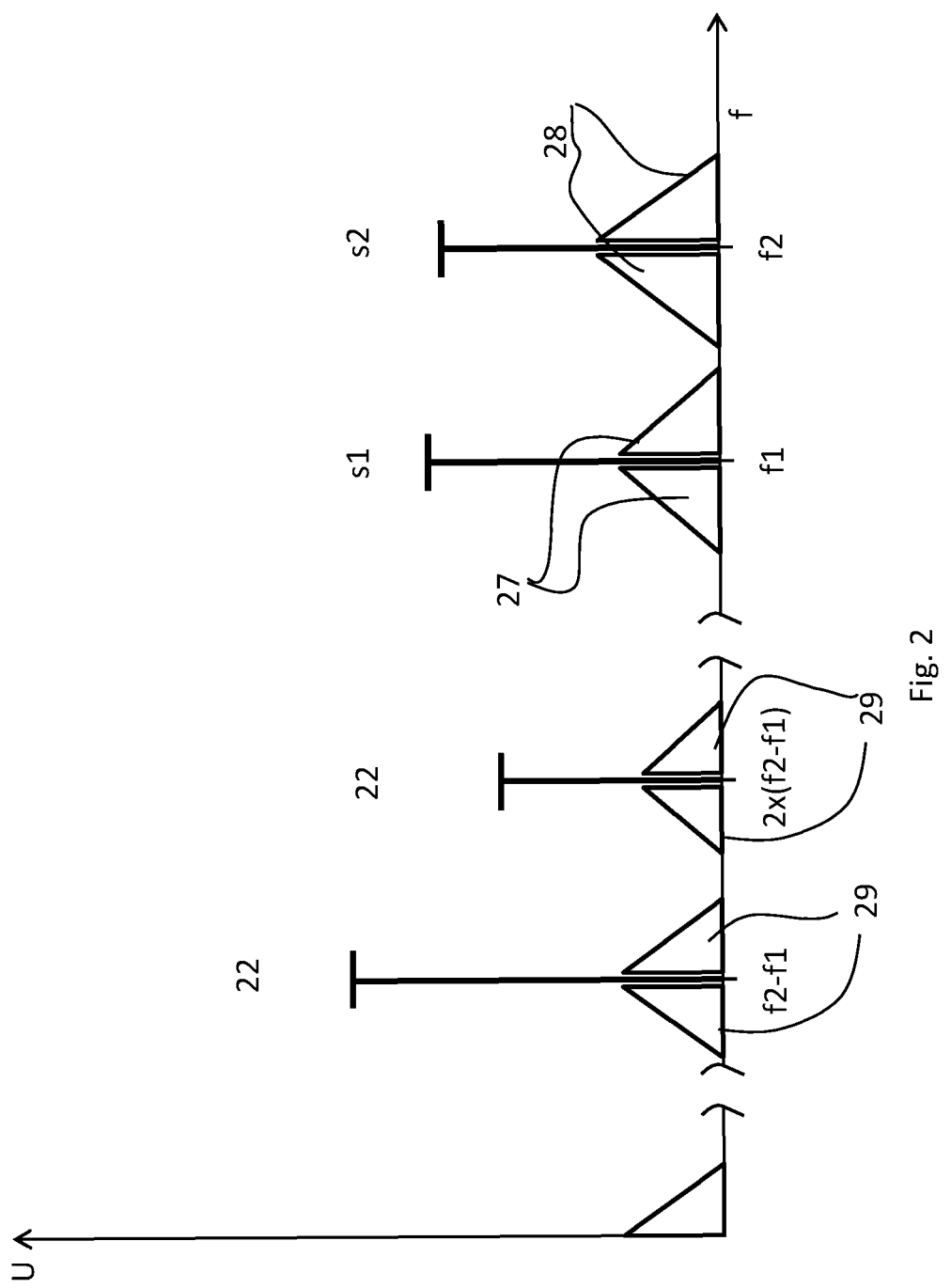

METHOD AND SECURITY MODULE FOR RECEIVING TWO SIGNALS

BACKGROUND

The present invention relates to a method, a security module and a system according to the preamble of the independent claims.

In particular, the present invention relates to a method for producing an output bit stream for a first signal of a first carrier frequency by a security module. The security module receives an input signal comprising the first signal and a second signal of a second carrier frequency. The input signal is demodulated with the aid of a first nonlinear component, wherein the first nonlinear component outputs a first baseband signal. A first bit stream is generated from the first baseband signal. The first bit stream is fed to an output logic. A mixed signal is formed from the first signal and the second signal, wherein the mixed signal comprises the first signal at the first carrier frequency, the second signal at the second carrier frequency and a mixed product at an intermediate frequency.

Further, the present invention relates to a security module comprising a receiving unit for receiving a first signal of a first carrier frequency and a second signal of a second carrier frequency. The security module comprises a first nonlinear component and a level-value adjusting unit. The first nonlinear component is adapted to form a first baseband signal from the first signal and the second signal, wherein the level-value adjusting unit generates a first bit stream from the first baseband signal.

Different methods are known for receiving input signals and demodulating signals, in particular by a contactless security module. A receiving unit receives a first signal from a transmitting-/receiving device. The received first signal is usually modified by means of an impedance converter, in particular an apparatus and/or unit for multiplying a voltage. Via the impedance converter, an amplitude, in particular a voltage amplitude, of the received first signal is increased. When the first signal is an amplitude-modulated signal, the first signal is demodulated with the aid of the impedance converter comprising at least one nonlinear component. The impedance converter is usually a voltage multiplier.

To generate an output bit stream from the first signal, said first signal is processed by means of a level-value adjusting unit. The level-value adjusting unit produces a bit stream of the first signal from the demodulated first signal. The level-value adjusting unit usually comprises the function of a comparator, with which the demodulated first signal is converted into a binary signal. The demodulated first signal is further smoothed in a second current path by means of a smoothing unit and a reference value for the comparator is formed therefrom. The reference value, which is preferably lower than the peak amplitude of the demodulated first signal at the input of the level-value adjusting unit, is considered as a reference value vis-à-vis the demodulated first signal for generating the first output bit stream. The level-value adjusting unit thus evaluates the demodulated first signal with respect to the reference value.

Due to the constant rise of wireless communication, the number of signals which are modulated at different carrier frequencies is increasing. The contactless security module frequently receives further signals, but at least one second signal, in addition to the first signal. Particularly when the second signal has a second carrier frequency that is close to the first carrier frequency of the first signal, and thus the first carrier frequency and the second carrier frequency are in the same reception range of the security module, and in addition the second signal has an amplitude approximately of the order of the first signal or higher, the two carrier frequencies of the first signal and of the second signal influence each other in such a fashion that the security module cannot generate from the input signal a unique output bit stream relating to the first signal. The security module only generates a disturbance value. Communication between the transmitting-/receiving device and the contactless security module is no longer ensured.

For example, the frequency ranges of GSM and UHF RFID are not only immediately adjacent, but overlap each other partially. For example, a UHF-RFID reading device transmits in the frequency range of 865 MHz and a GSM mobile phone transmits in the frequency range of 880-915 MHz. Due to a simple construction type, a UHF RFID transponder is ready to receive over a relatively broad band. The reception range of the UHF RFID transponder is usually limited only by the antenna. The UHF RFID transponder can receive both UHF RFID signals and GSM signals of an adjacent mobile phone. Both signals superimpose. The UHF RFID transponder of the state of the art cannot separate and decode the UHF RFID signals. Communication between the UHF RFID transponder and a UHF-RFID transmitting-/receiving device is not possible, in particular as soon as the amplitude of the GSM signal exceeds a threshold amplitude in relation to the UHF RFID signal.

SUMMARY

The object of the invention is to remedy the disadvantages of the state of the art. In particular, it is an object to make available an improved reception of a security module, whereby a communication between a transmitting-/receiving device and the security module is possible when at least one second signal is received in the same reception range as the first signal.

In a method according to the invention for producing an output bit stream for a first signal of a first carrier frequency by a security module, the security module receives an input signal comprising the first signal and a second signal, wherein the first signal and the second signal are received together, i.e. simultaneously. The input signal is demodulated by a first nonlinear component and a first baseband signal is generated. A first bit stream is generated from the first baseband signal. The first bit stream is fed to an output logic. Furthermore, a mixed signal is formed having the first signal at the first carrier frequency, the second signal at the second carrier frequency and a mixed product at an intermediate frequency.

According to the invention, the mixed product is demodulated by means of a second nonlinear component, wherein a second baseband signal is obtained. From the second baseband signal a second bit stream relating to the first signal in the mixed product is generated. The output logic produces an output bit stream, wherein the output logic selects either the first bit stream or the second bit stream as output bit stream for the first signal.

Due to different carrier frequencies of the first carrier frequency and the second carrier frequency, a mixed signal is formed by the first nonlinear component. In the mixed signal mixed products of the first and second signal are contained. The mixed products are at intermediate frequencies $(k \times f1 + m \times f2)$ and $|k \times f1 - m \times f2|$, with k, m=0, 1, 2, 3, . . . The order of the intermediate frequency rises in line with the distance of the intermediate frequencies from the carrier frequencies. This means that the first order is valid for k+m=2. The intermediate frequencies of the first order would be e.g. 2×f1, 2×f2, 1×f1+1×f2 and |f1−f2|. The intermediate frequencies of the second order (k+m=3) are valid for example for the intermediate frequencies 3×f1, 3×f2, 2×f1+1×f2, 1×f1+2×f2, |1×f1+2×f2| and |2×f1+1×f2|. As intermediate frequency thus integer multiples of sums and differences of the first and second carrier frequencies are possible. Intermediate frequencies are similar sidebands; however, they are also an integer multiple of the carrier frequencies of the sidebands. The intermediate frequency can be exactly one frequency. An intermediate frequency can also determine a frequency spectrum or a frequency range in which the mixed product occurs. For example, the carrier frequency of the first and/or second signal can be disposed within specified limits. For example, the first and/or second signal is a signal with a possible carrier frequency in a frequency range of 880 MHz to 915 MHz. The amplitude of the mixed products is substantially a sum of the levels of the first and second signals as well as a constant factor. The pattern of the first signal is contained in the mixed product. In particular, the pattern of an amplitude- or frequency-modulated first signal is maintained. A superposition of the first and second carrier frequency is not contained in the mixed product. The amplitude of the mixed products decreases with increasing order. Thus, mixed products of the first order have the highest amplitude. Each of the mixed products can be demodulated without being influenced by the second signal by the second demodulator that is suitable for demodulating the first signal.

Preferably, the first signal is an amplitude-modulated signal, for example a UHF RFID signal, and the second signal is a GMSK-modulated signal.

In principle, the security module can be embodied in a portable data carrier, hereinafter also referred to as tag, such as chip card, a secure mass memory card or a USB token. For example, the security module can be an identity card and/or a ticket. The security module can subsequently have the form of a tag. It can also be firmly incorporated in a module or body, such as a Trusted Platform Module (TPM), am M2M module, a user identification module or a decoder module. The security module can be provided for integration in a notebook, mobile phone, computer or keyboard. Preferably, the security module has a processor and a memory. The security module is particularly adapted for communication over an air interface, for example in a frequency range of RFID, particularly UHF RFID. The security module can also be adapted as a UHF RFID transponder.

A transmitting-/receiving device, hereinafter also called transmitter, serves for communicating with the security module. The transmitting-/receiving device can be made available as a card reader, in particular as a mobile unit, for example as an accessory to a POS system, on a computer or a mobile phone, as a firmly installed device, in particular for access control, or as an integrated unit in a notebook, mobile phone, computer or keyboard.

A nonlinear component is an electrical and/or electronic component with a nonlinear relationship between current and voltage. A current-voltage characteristic extends in nonlinear fashion. A nonlinear component can be merely a single nonlinear component or also a nonlinear network. The nonlinear network comprises components whose interconnection in total results in a nonlinear current-voltage characteristic. A nonlinear component can be a rectifier diode, i.e. a pn junction, a collector-emitter junction of a transistor or a tube. A nonlinear network can be an interconnection of rectifier diodes. For example, a voltage multiplier with diode circuit is a nonlinear network.

With the present invention it is now possible, inter alia, to operate a mobile phone using GSM services in the vicinity of a UHF RFID transponder, without influencing, in particular disturbing, the communication between the UHF-RFID transmitting-/receiving unit and the UHF RFID transponder. Thus, the UHF RFID transponder cannot be adversely affected, in particular disturbed, by GSM signals in its communication.

In one embodiment it can be provided that the output logic combines the first bit stream with the second bit stream. Once the output logic detects that the security module receives the second signal, the output logic will switch from the first bit stream to the second bit stream for outputting the output bit stream for the first signal. During the switching, an interruption-free transition is effected from the first to the second bit stream and vice versa. The output bit stream corresponds to the bit stream of the first signal; i.e. the output bit stream reproduces the data contained in the first signal. An interruption or an error in the output bit stream, in particular error bits or missing bits, are not present.

The mixed signal can be filtered with the aid of a frequency filter. The frequency filter is laid out for at least one predetermined intermediate frequency. Unwanted frequency components are filtered out. According to its layout, the frequency filter preferably outputs merely a mixed product from the mixed signal. The frequency filter can be a bandpass filter. With the frequency filter, mixed products of input signals from one, in particular closely limited, frequency range can be permitted to pass. The frequency filter can be laid out in narrow-band fashion for a predetermined frequency or for a predetermined frequency range independently of a possible intermediate frequency. Further, the frequency filter can be adapted as a high-pass filter. Here, the behavior of a real high-pass filter together with the formation of amplitudes in mixed products of higher order can be utilized, so that eventually only one mixed product is permitted to pass. It can be ensured that only a specific mixed product at an intermediate frequency is fed to the second nonlinear component.

In one embodiment it can be provided that the first and/or second nonlinear component increases the amplitude of the input signal, the first and/or second signal in addition to outputting a first and/or second baseband signal. The second nonlinear component can increase the amplitude of the mixed product. Further, the first and/or second nonlinear component can comprise the function of a mixer and/or a demodulator. By means of the function of the mixer, mixed products at at least one of the above-listed intermediate frequencies are generated from the first and second signal of different carrier frequencies.

In one embodiment, a first and/or second level-value adjusting unit can generate the first and/or second bit stream from the first and/or second baseband signal. For this purpose, the first baseband signal can be fed to the first level-value adjusting unit. Further, the second baseband signal can be fed to the second level-value adjusting unit. The first and/or second level-value adjusting unit generates the first and/or second bit stream with reference to a first and/or second reference value. The first and/or second reference value is preferably a constant value, in particular a direct voltage value. The first and/or second reference value can be formed by a constant voltage source, for example with the aid of a Z diode. Further, the first and/or second reference value can be obtained from the first and/or second baseband signal, for example via a conventional rectifier diode and a smoothing circuit comprising a capacitor. Preferably, the first and/or second reference value adjusts to the first or second baseband signal. This means that when the first and/or second baseband signal undergoes a change of the basic amplitude (direct voltage portion), the first and/or second reference value will change accordingly. For example, the basic amplitude of the first baseband signal is at 0.7 V, wherein peak amplitudes can have a value of 1.3 V. Analogously, the first and/or second reference value can depend on the mixed signal, the first signal and/or the second signal.

The first and/or second level-value adjusting unit can comprise a comparator for matching the first and/or second baseband signal relative to the first and/or second reference value. With the first and/or second level-value adjusting unit, a threshold value can be determined of the first and/or second baseband signal for outputting the first and/or second bit stream, for example whether the amplitude of the first and/or second baseband signal is a logical "1" or a logical "0". In other words, with the aid of the first and/or second reference value, a threshold is determined for generating the first and/or second bit stream.

The output logic can switch from the first bit stream to the second bit stream when the security module receives the second signal. For this purpose, the output logic can comprise a detection unit which examines the input signal for the receipt of the second signal. Upon receipt of the second signal, the output logic switches to the second bit stream.

Further, the output logic can analyze the first bit stream and the second bit stream, i.e. particularly the input of the output logic. If the second signal is received, an output value results at the output of the second nonlinear component and possibly a disturbance value in the first bit stream results at the input of the output logic for the first bit stream. Accordingly, the output logic causes the switch or the change-over from the first bit stream to the second bit stream.

Preferably, the mixed product is formed only when the second signal is received. Thus, at the output of the second level-adjusting unit and thus in the second bit stream, a relevant signal pattern will result only when the second signal is received by the security module. The output logic can check the second bit stream for whether the second bit stream comprises a valid signal pattern. In accordance with the check result, the output logic can cause the switch from the first to the second bit stream and vice versa. The output logic can check the plausibility of the signal pattern of the first and/or second bit stream.

The demodulation by the first and/or second nonlinear component can be executed in various ways, and depends substantially on the type of modulation and/or encoding of the first signal, for example ASK modulation (amplitude modulation), FSK modulation (frequency modulation) or PSK (phase angle modulation). The first and/or second nonlinear component in one embodiment can be executed merely as a diode, for example as a network in the form of a first or second voltage multiplier. In particular in an ASK modulation employing nonlinear components can be sufficient for demodulation. It is advantageous to employ a voltage multiplier with diode circuit. In such an embodiment, the function of the nonlinear component of a mixer and simultaneously of the increase of the amplitude of the first and/or second signal and/or the first baseband signal can be used, wherein the signal pattern, presently the bit stream, of the first signal is not altered.

Usually, the first signal is employed for supplying the security module with energy. After the second signal has likewise been received by the security module, it can be provided in one embodiment that the security module likewise adds the energy of the second signal to its energy supply. In particular it can be provided that the second signal is used as the main energy carrier and the second signal is ignored by the security module as an information carrier.

In one embodiment, it can be provided that the security module comprises a receiving unit. The receiving unit of the security module comprises an antenna in particular. The receiving unit is adapted for a reception range, i.e. for receiving signals in a specific frequency spectrum. The first carrier frequency of the first signal and the second carrier frequency of the second signal form part of this frequency spectrum. In particular, when the first and second carrier frequency lie closely together spectrally, for example UHF RFID and GSM, the receiving unit can receive and make further use of the signals of the first and second carrier frequency. The method according to the invention is particularly advantageous in an application for UHF-RFID security modules in the vicinity of GSM signals.

A security module according to the invention comprises a receiving unit for receiving the first signal of a first carrier frequency and a second signal of a second carrier frequency. Further, the security module comprises a first nonlinear component. The first nonlinear component is adapted to form a mixed signal from the received first and second signal. The mixed signal has a first baseband signal. A first level-value adjusting unit generates a first bit stream from the first baseband signal. Moreover, the security module has a first frequency filter, a second nonlinear component and an output logic. The frequency filter is adapted to filter a mixed product out of the mixed signal of the first nonlinear component. The second nonlinear component is adapted to demodulate the mixed product, and preferably to increase an amplitude of the mixed product. The output logic has an input for the first bit stream and an input for the second bit stream, so that the demodulated mixed product is fed to the output logic as a second bit stream. The output logic is adapted to switch between the first and the second bit stream and to form a bit stream of the first signal from the first and second bit stream.

Accordingly, the security module according to the invention comprises two nonlinear components. For demodulation of the first signal, the first nonlinear component demodulates the input signal and the second nonlinear component demodulates merely a mixed product of the input signal with respect to the signal pattern of the first signal. The output logic is adapted to switch between the first bit stream and the second bit stream for outputting the bit stream of the first signal. The switch is effected in dependence on whether the second signal is received by the security module. With the aid of the frequency filter, provided that the second signal is received, merely a mixed product is filtered out of the mixed signal, said mixed product being employed for further processing, in particular for demodulation with reference to the first signal.

In an advantageous embodiment the frequency filter can be a bandpass filter. The bandpass filter is particularly suitable to permit signals of a frequency band, i.e. of a specific frequency spectrum, to pass. The frequency band preferably corresponds to an above-described intermediate frequency of a mixed product. In particular, the frequency filter can be adapted as low-pass filter or high-pass filter.

As already described, the first and/or second nonlinear component assumes the function of a demodulator, wherein, optionally, the first and/or second level-value adjusting unit can be involved for generating the first and/or second bit stream.

A system according to the invention is adapted to execute a method or has a security module, as already explained.

The invention can be used in a subsequent method and system:

1. A method for extending the range of a contactless UHF-RFID security module for receiving a first signal from a first transmitter, wherein the first transmitter transmits the first signal at a first carrier frequency, wherein a first bit stream is modulated by means of a first modulation method at the first carrier frequency; a second transmitter transmits a second signal at a second carrier frequency; the contactless UHF-RFID security module receives the first and second signal; and the contactless UHF-RFID security module demodulates the first signal in accordance with the first modulation method; characterized in that
   the first carrier frequency is in the same frequency spectrum as the second carrier frequency and the first carrier frequency is not equal to the second carrier frequency;
   the first signal forms a mixed signal with the second signal; and
   the second transmitter transmits the second signal as a signal that is unmodulated for the security module.
2. The method, further characterized in that the second signal is an energy signal.
3. The method, further characterized in that a central unit controls the first and second transmitter.
4. The method, further characterized in that only one transmitter transmits the first signal in the range of the contactless UHF-RFID security module.
5. The method, further characterized in that the contactless UHF-RFID security module ascertains a local position of the contactless UHF-RFID security module from the first and second signal, in particular the first and second carrier frequency, preferably from the mixed products.
6. The method, further characterized in that the contactless UHF-RFID security module transmits the local position.
7. The method, further characterized in that the contactless UHF-RFID security module activates a function of the contactless UHF-RFID security module on the basis of the first and second carrier frequency, in particular on the basis of a frequency of the mixed products.
8. The method, further characterized in that the central unit and/or the first and/or the second transmitter sets an energy supply of the central unit and/or the first and/or the second transmitter on the basis of the local position of the contactless UHF-RFID security module.
9. The method, further characterized in that only the first transmitter communicates with the contactless UHF-RFID security module.
10. A system for extending the range of a contactless UHF-RFID security module, wherein the system comprises a first transmitter, a second transmitter and a contactless UHF-RFID security module, the first transmitter is adapted to transmit a first signal at a first carrier frequency, wherein the first signal comprises a first bit stream that is modulated at the first carrier frequency by a first modulation method, the second transmitter is adapted to transmit a second signal at a second carrier frequency, and the contactless UHF-RFID security module is adapted to receive the first signal and the second signal, wherein the security module is adapted as a demodulator for demodulating the first signal and generating an output bit stream of the first signal in accordance with the first modulation method, characterized in that
   the first carrier frequency is in the same frequency range as the second carrier frequency and the first carrier frequency is not equal to the second carrier frequency; and
   the second signal is a signal that is unmodulated for the security module and/or cannot be demodulated thereby.
11. The system, further characterized in that the second signal is an energy signal.
12. The system, further characterized in that the second signal comprises a bit stream of the second signal, wherein the bit stream of the second signal is present in a form modulated by means of a second modulation method and the second modulation method is different from the first modulation method.
13. The system, further characterized in that the system comprises a central unit for controlling the first and second transmitter.
14. The system, further characterized in that the contactless UHF-RFID security module is adapted to ascertain a local position of the contactless UHF-RFID security module from the first and second signal, in particular from the first and second carrier frequency.
15. The system, further characterized in that the central unit is connected to the first and/or second transmitter in wireless fashion, in particular WLAN or Bluetooth, or in wired fashion, in particular LAN or USB.

Further, it would be conceivable to apply the invention, partially in compliance with the method and/or system for range extension, for communication between the first and second transmitter, as follows:

A method for communication between a first transmitter, a second transmitter and a UHF-RFID security module, wherein
   for communication with the UHF-RFID security module,
      the first transmitter and/or second transmitter transmits a first signal at a first carrier frequency,
      the first signal comprises a first bit stream which is modulated in the first signal by means of a first modulation method,
      the UHF-RFID security module receives the first and second signal and demodulates the first signal with the aid of a first demodulator with reference to the first modulation method;
   for communication between the first and second transmitter, the first and/or second transmitter transmits a second signal at a second carrier frequency, characterized in that
   the second signal comprises a second bit stream which is modulated in the second signal by means of a second modulation method, and
   the second and/or first transmitter demodulates the second signal with reference to the second modulation method.

A system for communication between a first transmitter, a second transmitter and a UHF-RFID security module can be adapted to carry out the foregoing method.

Preferably, the system and/or method is adapted according to the following characteristics:
   second signal comprises control data for controlling the first and/or second transmitter.
   control data include information about settings for the first and/or second carrier frequency, commands for switching on and off the first and/or second transmitter, particularly for a span of time, reset commands, settings for transmitting power. second signal comprises communication contents with UHF-RFID security module, wherein the communication range is extended; the first and/or second transmitter serve for forwarding.
   first modulation method is preferably ASK modulation.

second modulation method is preferably PSK or FSK modulation.

BRIEF DESCRIPTION OF THE DRAWINGS

The invention will hereinafter be explained further by way of example with reference to the drawings. There are shown:

FIG. 1b a representation of a signal pattern with reference to the block diagram of FIG. 1a;

FIG. 2 a schematic frequency diagram according to the invention;

FIG. 6 a control diagram of the application example of FIG. 5a.

DETAILED DESCRIPTION OF VARIOUS EMBODIMENTS

Figure 1A:
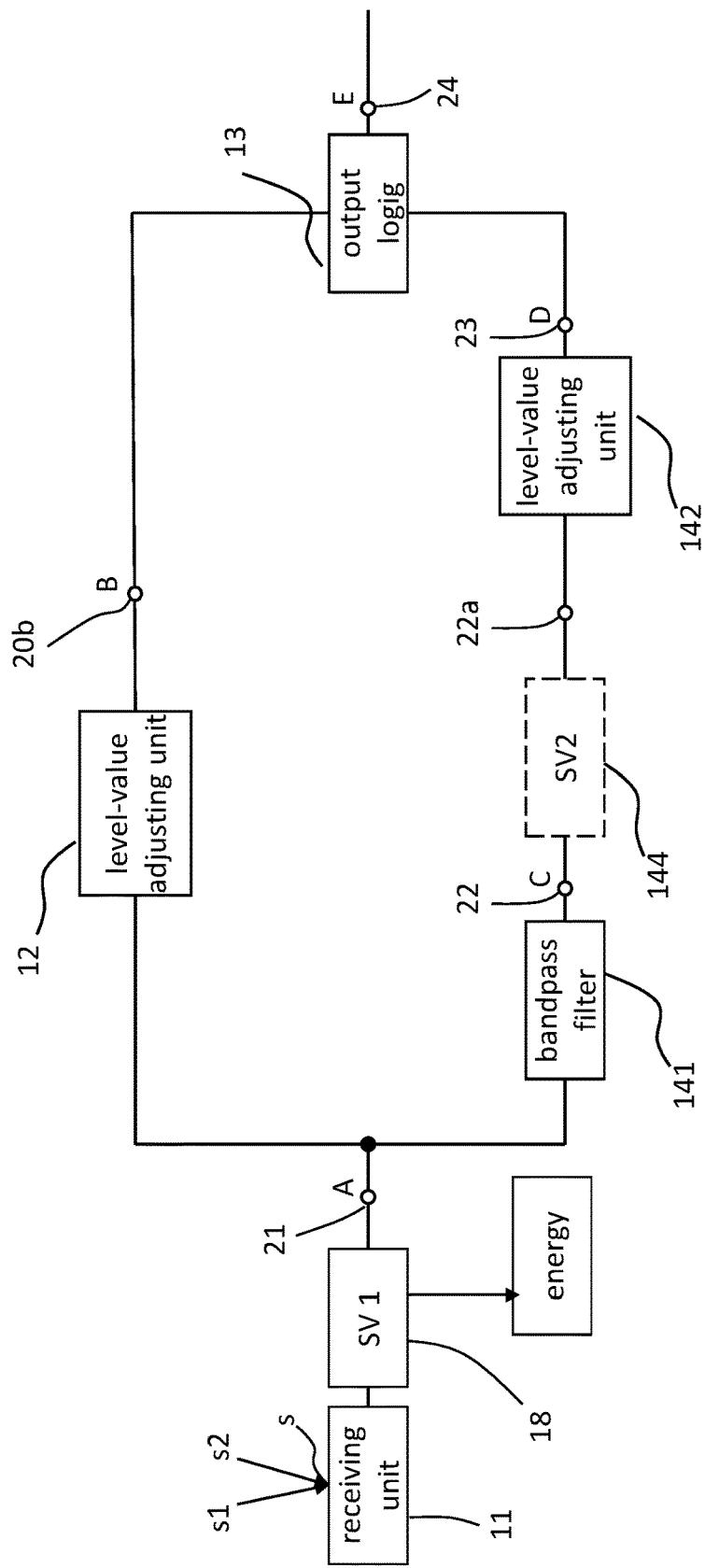
FIG. 1a a block diagram of one embodiment example according to the invention.

In FIG. 1a a block diagram is represented for one embodiment example of a method according to the invention.

A receiving unit 11 receives an input signal s. The input signal s comprises a first signal s1 and a second signal s2. The first signal s1 in this embodiment example is a UHF RFID signal at a first carrier frequency f1 of about 865 MHz. The second signal s2 is a GSM signal at a second carrier frequency f2 of approximately 915 MHz. The input signal s is forwarded by the receiving unit 11 to a first nonlinear component 18, presently a first voltage multiplier (SV1) 18. For the sake of simplicity and better understanding, in the following merely the first voltage multiplier 18 will be mentioned instead of the first nonlinear component 18. The first voltage multiplier 18 is of a structure similar to a charge pump and comprises an interconnection of diodes and capacitors. This first voltage multiplier 18 has the function of an electronic mixer due to its nonlinear characteristic.

The first voltage multiplier 18 generates a mixed signal 21 from the input signal s. The mixed signal 21 in a first baseband signal comprises both the first signal s1 at its first carrier frequency f1 and the second signal s2 at its second carrier frequency f2 Further, in the mixed signal 21 there are contained mixed products of the first and second signal s1, s2 (see. FIG. 2). Mixed products are signals at intermediate frequencies which are determined by the first and second carrier frequency f1, f2. The first voltage multiplier 18 demodulates the input signal s. The mixed signal 21 is forwarded to a first level-value adjusting unit 12. The first level-value adjusting unit 12 evaluates the mixed signal 21 with reference to a first reference value and generates a first bit stream 20b on the basis of the first reference value from the mixed signal 21.

Parallel to the first level-value adjusting unit 12, the mixed signal 21 is forwarded to a frequency filter 141, which is a bandpass filter 141 for low frequencies in this embodiment, to a second nonlinear component 144, presently a second voltage multiplier (SV2) 144, and to a second level-value adjusting unit 142. The frequency filter 141, the second voltage multiplier 144 and the second level-value adjusting unit 142 are connected in series. For better understanding and greater ease of reading, in the following the second nonlinear component 144 will be referred to as the second voltage multiplier 144.

The bandpass filter 141 is configured for a mixed product 22 with the carrier frequency |f2−f1| and thus for 50 MHz. At the same time the first mixed product 22 from the mixed signal 21 is the mixed product with the lowest (first) order and as a rule the mixed product with the highest amplitude. The bandpass filter 141 ensures that exclusively the first mixed product 22 is output. Other portions, especially mixed products, in the mixed signal 21 are filtered out.

The first mixed product 22 is fed to the second voltage multiplier 144, wherein the amplitude of the first mixed product 22 is additionally amplified by the second voltage multiplier 144. The second voltage multiplier 144 is also constructed similar to a charge pump. The second voltage multiplier 144 demodulates the first mixed product 22 in accordance with the modulation method of the first signal s1 and outputs a second baseband signal 22a. The second level-value adjusting unit 142 generates a second bit stream 23 from the second baseband signal 22a with reference to a second reference value. The second bit stream 23 and the first bit stream 20b are fed to an output logic 13. The output logic 13 combines the first bit stream 20b and the second bit stream 23. The output logic 13 outputs an output bit stream 24 of the first signal s1.

Figure 1B:
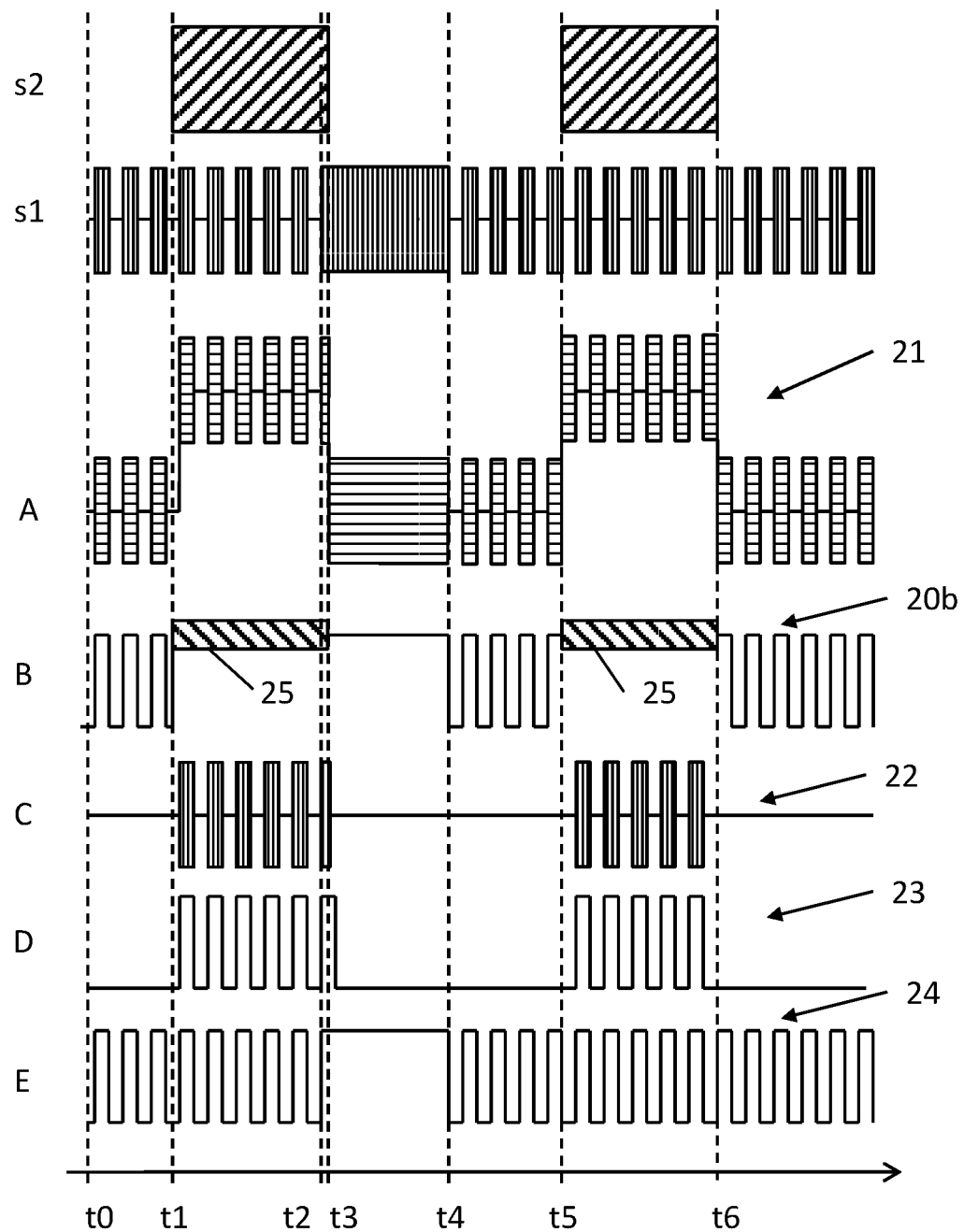

Subsequently, the principle of action of the invention will be illustrated with reference to the block diagram of FIG. 1a with the signal patterns represented in FIG. 1b. FIG. 1b shows signal patterns at the measuring points A to E and of the signals s1 and s2 at the times t0 to t6. Primarily, the signal processing will be explained.

In the time range t0-t1, the receiving unit 11 receives merely the first signal s1. This means that the mixed signal 21 at the output of the first voltage multiplier 18 comprises merely a single signal, namely the first signal s1 at its first carrier frequency f1. Thus, no mixed products are contained in the mixed signal 21. The first voltage multiplier 18 demodulates the first signal from the input signal s (see signal pattern, measurement point A). This means that the first baseband signal in the mixed signal 21 has the demodulated signal pattern of the first signal s1. The first level-value adjusting unit 12 outputs the first bit stream 20b which corresponds to the bit stream of the first signal s1 (see signal pattern, measurement point B).

The mixed signal 21 has no mixed products at intermediate frequencies. The output of the bandpass filter 141 filters no mixed product at an intermediate frequency and shows no signal pattern at its output, i.e. a zero signal (see signal pattern, measurement point C). The second voltage multiplier 144 receives no input signal. Accordingly, the second voltage multiplier 144 generates no signal. The second level-value adjusting unit 142 receives no input signal. The second bit stream 23 is thus zero (see signal pattern, measurement point D). The output logic 13 outputs the first bit stream 20b as output bit stream 24 of the first signal s1.

In the time interval t1-t2, the receiving unit 11 receives both the first signal s1 and the second signal s2, for example a GSM burst. The mixed signal 21 (see signal pattern, measurement point A) comprises the first and second signal s1 and s2, as well as their mixed products. The first voltage multiplier 18 outputs no unique signal flow. In particular, the first voltage multiplier 18 yields a mixed signal 21 with disturbed/polluted voltage curve. For example, the mixed signal 21 comprises the first signal s1 with a DC offset of an unknown amount, wherein mixed products pollute the pattern of the mixed signal 21 in addition. The first level-value adjusting unit 12 cannot generate a unique binary signal, in particular a bit stream, from the mixed signal 21. The level-value adjusting unit 12 outputs a disturbance 25 in the first bit stream 20b (see signal pattern, measurement point B).

The mixed signal 21 is applied to the bandpass filter 141. The bandpass filter 141 is configured for filtering a first mixed product 22 of the first order (f2−f1). At the output of the bandpass filter 141 therefore only the first mixed product 22 of the first order is applied (see signal pattern, measurement point C). Said first mixed product 22 of the first order is demodulated by the second voltage multiplier 144 and its amplitude is increased. The second voltage multiplier 144 outputs the second baseband signal 22a. The second level-value adjusting unit 142 generates the second bit stream 23 on the basis of the second baseband signal 22a (see signal pattern, measurement point D). The second bit stream 23 corresponds to the demodulated bit stream of the first signal s1. The second bit stream 23 is fed to the output logic 13 together with the first bit stream 20b. The output logic 13 detects the disturbance 25 in the first bit stream and switches from the first bit stream 20b to the filtered second bit stream 23.

The receiving unit 11 has received a modulated first signal s1 during the time interval t0 to t2. During the time interval t2-t3 the receiving unit 11 receives a first signal s1, however, which is unmodulated with respect to an amplitude modulation of 100%. The second signal s2 with a carrier frequency of 915 MHz continues to be received. Due to the second signal s2, the first bit stream 20b at the output of the first level-value adjusting unit 12 continues to have the disturbance signal 25 (see signal pattern, measurement point B). The bandpass filter 141 filters the mixed signal 21, so that the output of the bandpass filter 141 has the first mixed product 22 of the first order (see signal pattern, measurement point C). The second voltage multiplier 144 demodulates the first mixed product 22, increases its amplitude and accordingly outputs a second baseband signal 22a to the second level-value adjusting unit 142. The second level-value adjusting unit 142 generates the second bit stream 23 from the second baseband signal 22a with respect to the first signal s1 (see signal pattern, measurement point D). The level-value adjusting unit 142 outputs the second bit stream 23 to the output logic 13. The second bit stream 23 for the time interval t2-t3 corresponds to the pattern of the bit stream of the first signal s1. The output logic 13 detects from the disturbance signal 25 in the first bit stream 20b that the second signal s2 is received by the receiving unit 11 and continues outputting the second bit stream 23 as output bit stream 24 of the first signal s1 (see signal pattern, measurement point E).

In the time interval t3-t4, the first signal s1 is still present in unmodulated form with respect to an amplitude modulation of 100%. The second signal S2 has broken off at the time t3, so that the receiving unit 11 receives no second signal s2. The mixed signal 21 comprises merely the first signal s1 at its carrier frequency f1. The first voltage multiplier 18 demodulates the mixed signal 21 or first signal s1. The first level-value adjusting unit 12 outputs the demodulated first signal s1 as the first bit stream 20b (see measuring point B). Corresponding to the first signal s1, this partial pattern of the first bit stream 20b is logically "1". In the mixed signal 21 no mixed products are contained. Accordingly, the bandpass filter 141 outputs no mixed product 22 of the first-order (see measurement point C). The second voltage multiplier 144 accordingly outputs no second baseband signal 22a. The second level-value adjusting unit 142 generates no second bit stream 23. The output logic 24 outputs the first bit stream 20b as the output bit stream 24 at the measurement point E.

During the time interval t4-t5, the receiving unit 11 receives only the first signal s1. A signal processing is effected in analogy to the time interval t0-t1.

During the time interval t5-t6, the receiving unit 11 receives both the first signal s1 at its first carrier frequency f1 and the second signal s2 at its second carrier frequency f2. At the output of the first voltage multiplier 18 this causes a mixed signal 21 in analogy to the time interval t1-t2. A signal processing is effected according to the description of the time interval t1-t2.

In the time subsequent to the time t6, the receiving unit 11 receives merely the first signal s1. A signal processing is carried out in analogy to the description of the time interval t0-t1.

From the time t0, the pattern of the output bit stream 24 corresponds to the pattern of the bit stream of the first signal s1. Although the second signal s2 is received by the receiving unit 11 and the second signal s2 has to be considered as a disturbance signal for generating the bit stream 24 of the first signal s1, the bit stream 24 of the first signal s1 can be obtained.

In FIG. 2 the mixed signal 21 of the FIGS. 1a, 1b is represented in extracts in order to clarify the invention. The mixed signal 21 comprises the first signal s1 at the first carrier frequency f1 of 865 MHz and the second signal s2 at the second carrier frequency f2 of 915 MHz. The first and second carrier frequency f1, f2 are disposed on the same frequency band, are not equal, but mutually correspond approximately (f1≠f2^f1≈f2). Further, at intermediate frequencies mixed products 22 from the first and second signal s1, s2 are contained, with a first intermediate carrier frequency f2−f1 and a second intermediate carrier frequency 2×(f2−f1).

The amplitude of the mixed products decreases in line with increasing order, i.e. the amplitude of the mixed product of the first intermediate carrier frequency is higher than the amplitude of the mixed product of the second intermediate carrier frequency. With reference to FIGS. 1a and 1b, the first baseband signal comprises the mixed signal 21, i.e. mixed products of the first and second intermediate carrier frequencies and the first and second signal s1, s2. The second baseband signal 22a comprises merely mixed products of the intermediate carrier frequency f2−f1. In FIG. 2, out of the mixed products 22 merely the mixed products 22 of the carrier frequencies f2−f1 and 2×(f2−f1) are represented. Data of the signals s1, s2 and of the mixed products 22 are contained not only at the respective carrier frequency, but also at the frequency spectra, i.e. in frequency ranges around the carrier frequencies. The signal of the mixed product 22 of 1×f2−f2 is contained not only at 50 MHz, but in a spectrum of 47 to 53 MHz.

Figure 3:
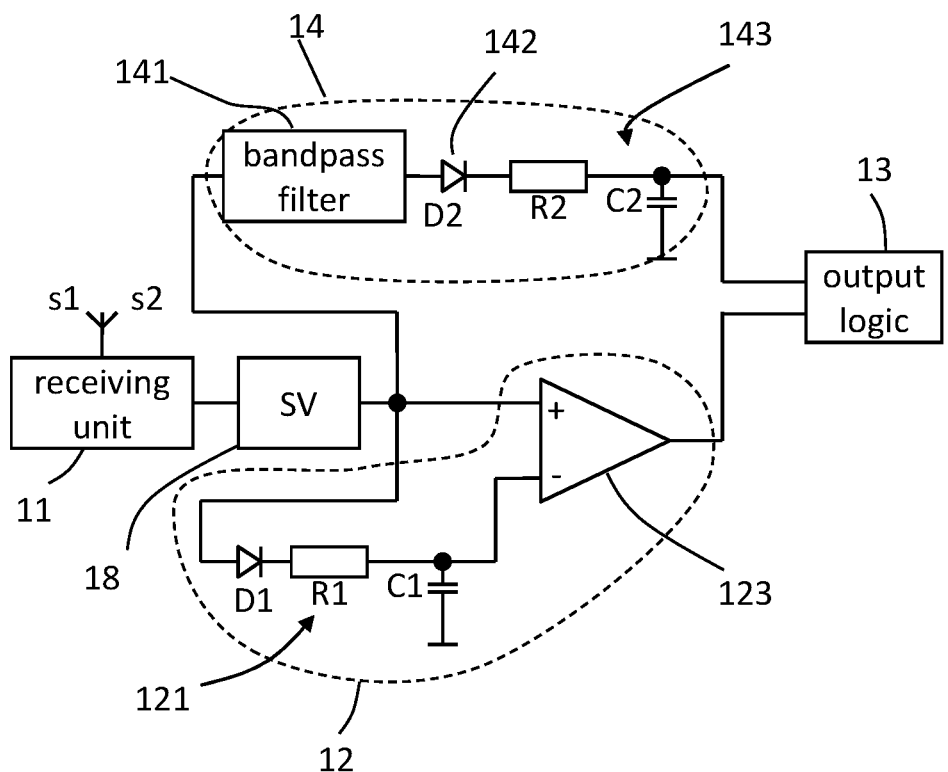
FIG. 3 a further embodiment example according to the invention.

In FIG. 3 circuit sections of the embodiment example of FIG. 1a are shown in greater detail. In particular, the first and second level adjusting unit 12, 142 are represented in detail in FIG. 3

The first level adjusting unit 12 comprises a first comparator 123 and a reference value generator 121. The reference value generator 121 has a first diode D1, a first ohmic resistor R1 and a first capacitor C1. The first diode D1 causes a voltage drop of the output signal of the first voltage multiplier 18 by its threshold voltage, e.g. 0.7 V, to a first reference voltage. Via the first ohmic resistor R1 and the first capacitor C1, the first reference voltage is smoothed and maintained at an approximately constant value. The smoothed first reference voltage is fed to the first comparator 123 as a reference value (negative input). Further, the output of the first voltage multiplier 18 is fed directly to the first comparator 123 as an input signal (positive input). If merely the first signal s is received, the first level adjusting unit 12 generates a unique binary signal. The threshold amplitude, i.e. the limit value at which a unique 1-level is detected, can be set via the diode. At the output of the first level adjusting unit 12, a unique first bit stream is output. In dependence on the modulation method, alternatively the first reference voltage can also be fed to the positive input of the first comparator 123, wherein the negative input is connected to the output of the first voltage multiplier 18.

If no second signal s2 is received by the receiving unit 11, the first signal s1 is rectified by the voltage multiplier 18 and the amplitude is increased. Since there is exclusively one single signal with one carrier frequency, no mixed products are created in the voltage multiplier 18. The first signal s1 at its carrier frequency f1 is applied directly at the input of the first comparator 123. From the first signal s1 a direct voltage is generated as the first reference value by means of the reference value generator 121, said reference value being about 0.7 V (threshold voltage D1) below the peak value of the first signal s1. The first comparator 123 is laid out for evaluating a difference value of at least 0.4 V. This means that at a low level of the first signal s1 the reference value is maintained and the amplitude at the input of the first comparator is lower than the first reference value. The first comparator 123 thus follows the signal pattern of the first signal s1 and outputs the first bit stream.

When both the first signal s1 and the second signal s2 are received by the receiving unit 11, the first signal s1 and second signal s2 superimpose. The mixed signal has a signal pattern with a change of the amplitude in an unknown amount. The first comparator 123 cannot generate a meaningful first bit stream from the mixed signal. As a result of the first comparator yields an inference value. The disturbance value is fed to the output logic 13.

The second level adjusting unit 142 can be adapted analogously to the to the first level adjusting unit. Alternatively, merely a diode D2 as nonlinear component 142, having the function of a mixer, and a signal processing unit 143, for example a second ohmic resistor R2 and a second capacitor C2, can be connected downstream of the frequency filter 141. For example, the signal processing unit 143 is used for filtering disturbing contents in the second bit stream.

Figure 4:
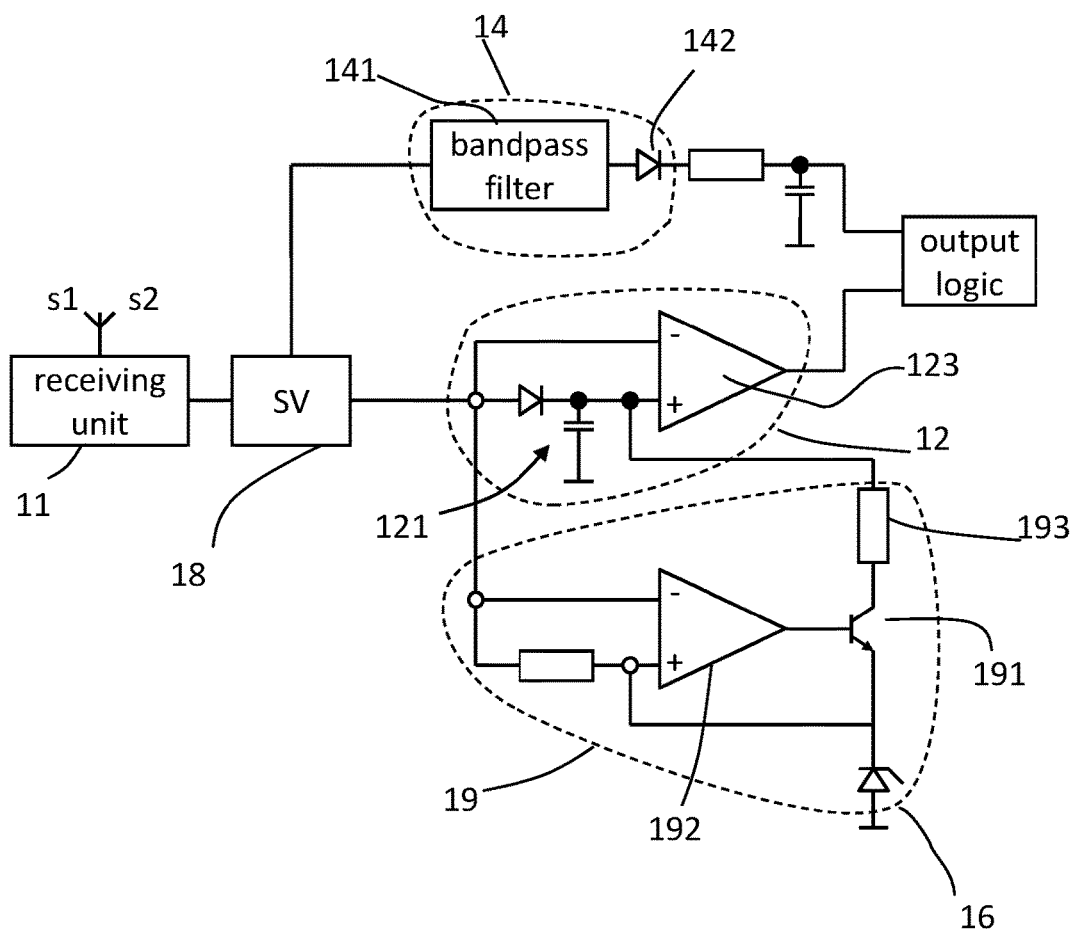
FIG. 4 a further embodiment example according to the invention.

In FIG. 4 a further embodiment example of the invention is represented. In particular, this is an extension 19 of the circuit of FIG. 3. In detail, it represents an adjustment of the first reference value of the first comparator 123. The extension 19 comprises a second comparator 192, an electronic switch 191 and a constant voltage source 16.

The positive input of the first comparator 123 is connected to the electronic switch 191 (e.g. collector input of a transistor) via a third ohmic resistor 193. Further, the electronic switch 191 is connected to the constant voltage source 16. The third ohmic resistor 193 limits the current flow to the constant voltage source 16. The output of the first voltage multiplier 18 is connected to the negative input of second comparator 192. The positive input of the second comparator 192 is connected to the output of the voltage multiplier 18 via a fourth ohmic resistor 194 and directly to the constant voltage source 16. The constant voltage source 16 makes available a constant voltage and a second reference value for the second comparator 192, for example 0.4 V. The second comparator 192 controls the electronic switch 191 via its output.

When the receiving unit 11 receives the first and second signal s1, s2, a first reference value with high amplitude is applied to the first comparator 123. When the receiving unit 11 receives only the first signal s1, the reference value generator 121 generates a first reference value that is relatively small in relation thereto. The first bit stream at the output of the first demodulator 123 corresponds to the bit stream of the first signal s1. When the second signal s2 is a signal with high level values, the first reference value of the reference value generator 121 could not drop fast enough to a matching reference value corresponding to the amplitude of the first signal s1 upon elimination or dropping of the second signal s2. As a consequence, the first demodulator 123 generates an erroneous first bit stream until the first reference value has adjusted to the amplitude of the first reference value generator 121. An adjustment of the smoothing factor and/or the capacity of the reference value generator 121 could not lead to a satisfactory result.

With the aid of the extension 19, the second comparator 192 detects when the first and second signal s1, s2 are eliminated and/or whether the first and second signal s1, s2 are received by the receiving unit 11. Once the first and second signal s1, s2 are not received, the level of the input signal at the negative input of the second comparator 192 decreases below its second reference value or the voltage of the constant voltage source 16. The second comparator 192 yields a 1-signal to the electronic switch 191. The electronic switch 191 establishes a connection between the first reference value of the first comparator 123 and the constant voltage source 16 and aligns the first reference value to the voltage of the constant voltage source 16. Too high a level of the first reference value at the first comparator 123 is thus quickly aligned to a low level corresponding to the constant voltage source 16.

The first reference value of the first comparator 123 can thus be quickly aligned to a reference value corresponding to the first signal s1 with the extension 19.

Figure 5A:
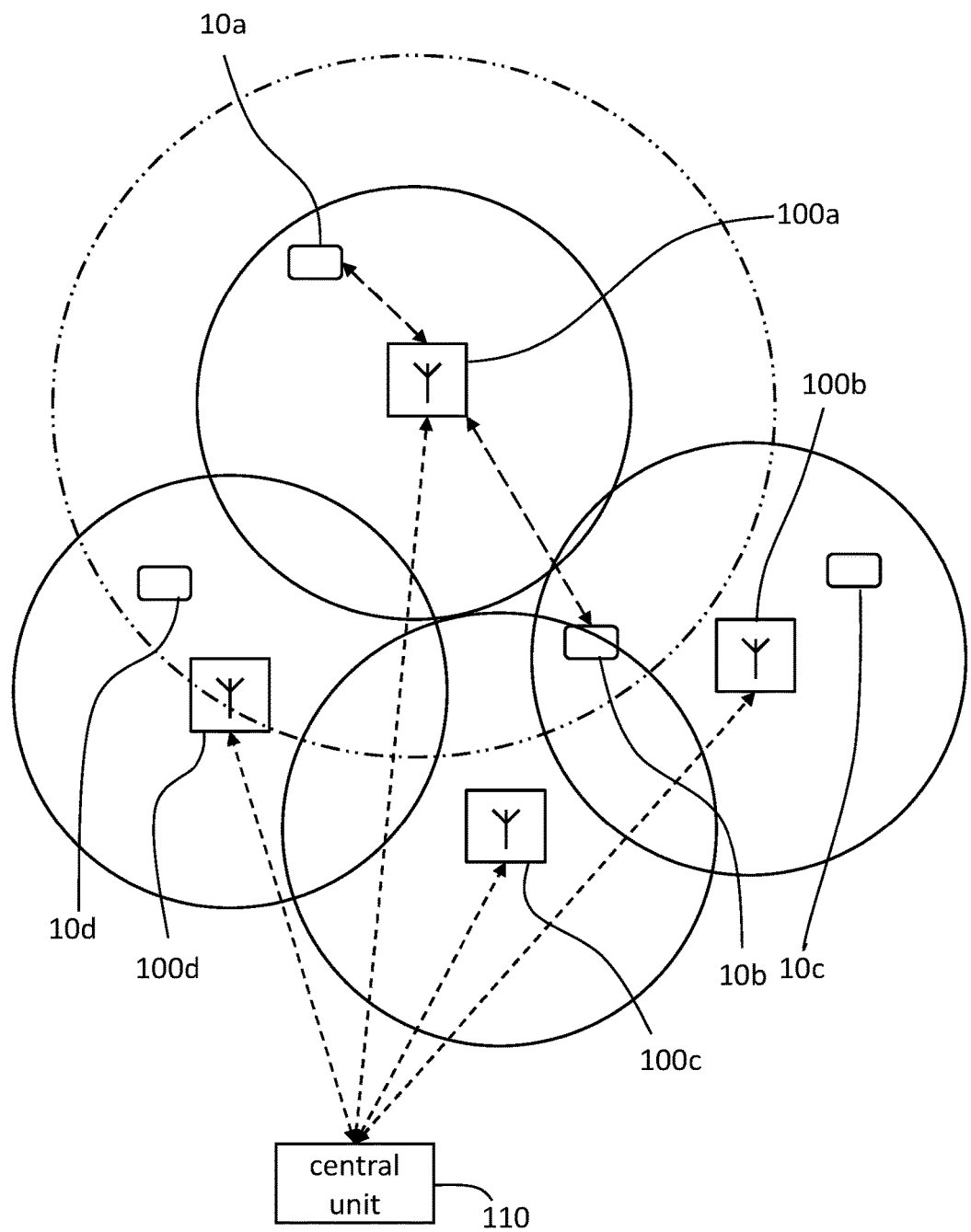
FIG. 5a an application example of the use of the invention for extending the range of security modules.

In FIG. 5a an embodiment example is represented of an application of the invention in UHF RFID tags and tags for range extension.

A plurality of UHF RFID transmitters 100a, 100b, 100c, 100d can receive responses from respective UHF RFID tags 10a, 10b, 10c, 10d within a specific radius (circles with continuous line around UHF RFID transmitters 100a, 100b, 100c, 100d). The UHF RFID tags 10a, 10b, 10c, 10d are equipped according to the invention. For communication between the UHF RFID transmitters 100a, 100b, 100c, 100d and the UHF RFID tags 10a, 10b, 10c, 10d, the UHF RFID tags 10a, 10b, 10c, 10d work in the electromagnetic far field, i.e. they send responses by means of modulated backscatter. The UHF RFID tags 10a, 10b, 10c, 10d do not have an energy supply of their own. Their range is therefore dependent on the electromagnetic far field. The first UHF RFID tag 10a can communicate with the first UHF RFID transmitter 100a in the field of said transmitter. A communication of the first UHF RFID tag 10a with the second/third/fourth UHF RFID transmitter 10b, 10c, 10d is not possible in principle, however. The second UHF RFID tag 10b is disposed in the communication range of the second and third UHF RFID transmitter 100b, 100c and can communicate with these. The fourth UHF RFID tag 10d is disposed in the communication range of merely the fourth UHF RFID transmitter 100d. For the second UHF RFID tag 10b to be able to communicate with the first UHF RFID transmitter 100a, more energy must be made available to the second UHF RFID tag 10b. For this purpose, the second UHF RFID tag 10b can draw energy from the electromagnetic fields of the second and third UHF RFID transmitters 100b, 100c.

The second and third UHF RFID transmitters 100b, 100c each transmit an unmodulated second and third signal s2, s3 at a respective second and third carrier frequency f2, f3. The first UHF RFID transmitter 100a transmits a request as a modulated first signal s1 at a first carrier frequency f1 to the second UHF RFID tag 10b. In principle, the first, second and third carrier frequency are disposed within the same frequency band and $f1 \neq f2$; $f1 \neq f3$; $f1 \approx f2$; $f1 \approx f3$. The modulated first signal s1 and the unmodulated signals s2, s3 are received by the second UHF RFID tag 10b. Due to the additional second and third signals s2, s3, which superimpose with the first signal s1, mixed products are formed in the second UHF RFID tag 10b. The mixed products can be used for further signal processing by the second UHF RFID tag 10. The energy content of the first, second and third signal s1, s2, s3 is available in sum to the second UHF RFID tag 10b. The second UHF RFID tag 10b receives the first, second and third signal s1, s2, s3 and generates a bit stream of the first signal s1 with the aid of the invention. The second UHF RFID tag 10b produces a first response.

Due to the plurality of signals, namely the first, second and third signal s1, s2, s3, a higher energy is made available to the second UHF RFID tag 10b for operation than in comparison to merely one single first signal s1. The return transmission range is not increased in principle. Due to the energy of the first UHF RFID transmitter 100a said energy is sufficient for evaluating the return transmission signal or the first response. When the second UHF RFID tag 10b is outside the energy range of the first UHF RFID transmitter 100a, but within its communication range, through the additional energy supply of the second UHF RFID transmitter 100b the second UHF RFID tag 100b can be provided with sufficient energy for communicating with the first UHF RFID transmitter 100a. Due to the additional energy supply of the second UHF RFID tag 10b, it can evaluate signals of a lower amplitude. The distance between the first UHF RFID transmitter 100a and the second UHF RFID tag 10b can be increased (see dashed and double pointed line around the first UHF RFID transmitter 100a). The same applies to the fourth UHF RFID tag 10d in connection with using the fourth UHF RFID transmitter 100d for communication with the first UHF RFID transmitter 100a.

The energy range is the range of a UHF RFID transmitter within which a UHF RFID tag can be supplied with sufficient energy for its operation. The communication range is the range of a UHF RFID tag within which a UHF RFID tag could communicate with a UHF RFID transmitter, provided that the UHF RFID tag is supplied with sufficient energy for the operation of the UHF RFID tag. The energy range is smaller than the communication range as a rule.

As can be seen from FIG. 5a, the electromagnetic far field of the second UHF RFID transmitter 100b reaches the third UHF RFID tag 10c. However, the communication range of the first UHF RFID transmitter 100a cannot be sufficiently increased for the third UHF RFID tag 10c to be able to respond to the first UHF RFID transmitter 100a.

In FIG. 5a the communication starting from the first UHF RFID transmitter 100a is represented merely by way of example. The communication can be transferred accordingly to another UHF RFID transmitter, for example the second, third and/or fourth UHF RFID transmitter 100b, 100c, 100d. In principle, it should be noted that only one UHF RFID transmitter transmits a valid communication signal, i.e. a modulated UHF RFID signal. Other transmitters (according to FIG. 5a the second, third and fourth UHF RFID transmitter 100b, 100c, 100d) preferably transmit an unmodulated signal. By unmodulated signals merely additional energy is made available to the UHF RFID tag. With the aid of the invention, the UHF RFID tag can generate a bit stream corresponding to the modulated signal from the superimposed signals. If two UHF RFID transmitters simultaneously transmitted modulated signals detectable by the UHF RFID tag, the UHF RFID tag could not generate a bit stream from the superposition of the two modulated signals.

Figure 5B:
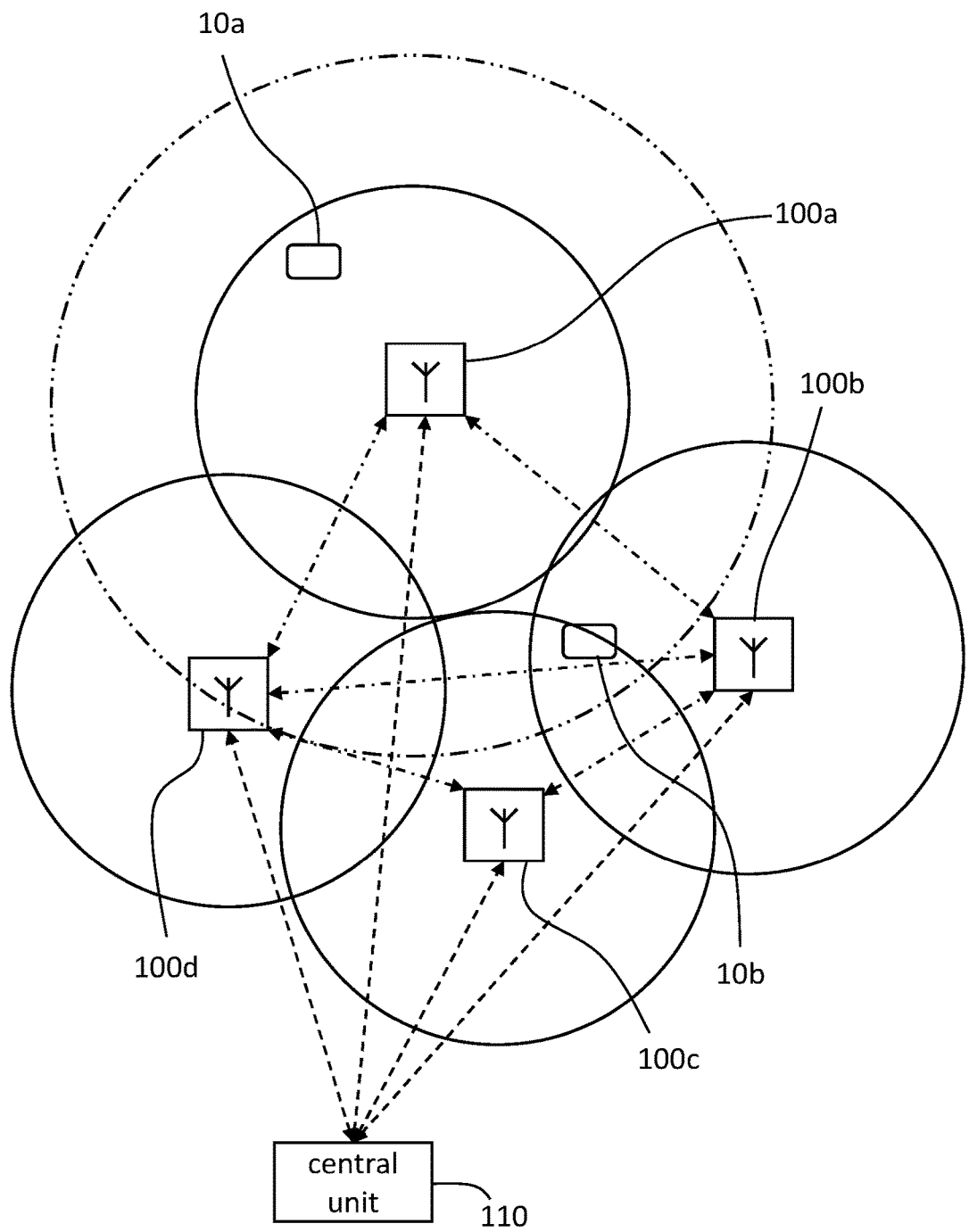
FIG. 5b an embodiment example for controlling the range extension.

In FIG. 5b an embodiment example is represented of a control for the range extension according to FIG. 5a. A central unit 110 controls the UHF RFID transmitters 100a, 100b, 100c, 100d. The central unit 110 determines which UHF RFID transmitter 100a, 100b, 100c, 100d may communicate with the first and/or second RFID tag 10a, 10b (only first and second RFID tag 10a, 10b represented in FIG. 5b). In particular, the central unit 110 determines which UHF RFID transmitter 100a, 100b, 100c, 100d transmits a first signal that can be demodulated by the first and/or second RFID tag 10a, 10b and which one of the UHF RFID transmitters 100a, 100b, 100c, 100d transmits an unmodulated signal or signal that cannot be demodulated by the first and/or second UHF RFID tag. Thus, the first UHF RFID transmitter 100a transmits a signal that can be demodulated by the first RFID tag 10a, whereas the second, third and fourth UHF RFID transmitter 100b, 100c, 100d respectively transmits a signal that is unmodulated for the first RFID tag. Thus, the communication range can be extended between the first UHF RFID transmitter 100a and the first RFID tag 10a. Analogously, the fourth UHF RFID transmitter 100d transmits a signal that can be demodulated by the second RFID tag 10b, whereas the first, second and third UHF RFID transmitter 100a, 100b, 100c respectively transmits a signal that is unmodulated for the second RFID tag 10b. Thus, the communication range between the fourth UHF RFID transmitter 100d and the second RFID tag 10b can be extended. However, the system is adapted such that either the first and fourth UHF RFID transmitter 100a, 100d do not transmit simultaneously or that the first and fourth UHF RFID transmitter 100a, 100d each transmit a signal with different type of modulation.

Preferably, the central unit 110 directs one UHF RFID transmitter 100a, 100b, 100c, 100d in targeted fashion. Alternatively, also a plurality of the first, second, third and/or fourth UHF RFID transmitters 100a, 100b, 100c, 100d can be instructed to communicate with the first and/or second UHF RFID tag 10a, 10b, wherein the first, second, third and/or fourth UHF RFID transmitters 100a, 100b, 100c, 100d do not transmit a modulated signal relating to the first and/or second UHF RFID tag 10a, 10b simultaneously.

In addition to the communication, a spatial location of the first and/or second UHF RFID tags 10a, 10b can be effected by evaluating the signal with reference to the carrier frequencies. Besides the control of the UHF RFID transmitters, the central unit 110 can assume the function of a central communication point, for example as distribution center of all messages.

Figure 6:
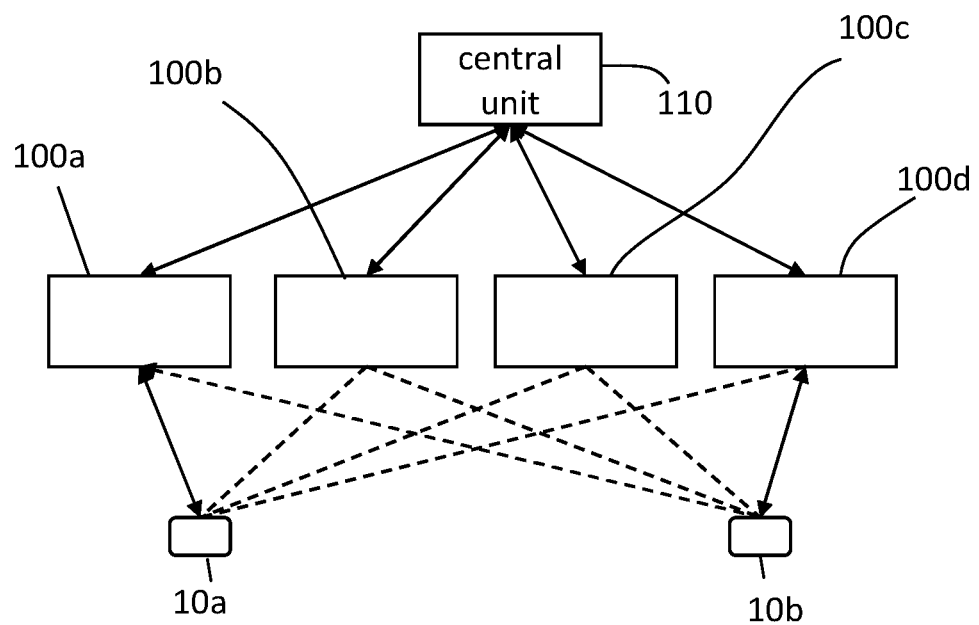

In FIG. 6 another application example of the invention is represented. The spatial structure is similar to FIG. 5a. Instead of the communication between a UHF RFID transmitter 100a, 100b, 100c, 100d and one of UHF RFID tags 10a, 10b, 10c, 10d, in this figure, a communication is considered between the UHF RFID transmitters 100a, 100b, 100c, 100d among themselves.

For communication between the UHF RFID transmitters 100a, 100b, 100c, 100d and the UHF RFID tags 10a, 10b, 10c, the relevant UHF RFID transmitter, for example the first one, 100a, transmits a modulated signal. The second, third and fourth UHF RFID transmitters 100b, 100c, 100d transmit an unmodulated signal. Instead of an unmodulated signal, the second, third and fourth UHF RFID transmitters 100b, 100c, 100d can transmit a signal that cannot be demodulated by the first, second and third UHF RFID tag 10a, 10b, 10c. Thus, such a signal also appears as a disturbance signal or as an unmodulated signal for the first, second and third UHF RFID tag 10a, 10b, 10c. The circumstance that a signal cannot be demodulated does not imply that it is 100% unmodulated at the carrier frequency. Rather, the signal can have data which are modulated at a carrier frequency with a modulation method or coding method that is unknown to the UHF RFID tag. While, for example, data are transferred between the first, second, third and fourth UHF RFID transmitter 100a, 100b, 100c, 100d and the first, second and third UHF RFID tag 10a, 10b, 10c by means of ASK modulation, the first, second, third and/or fourth UHF RFID transmitter 100a, 100b, 100c, 100d can transmit a signal with FSK modulation. This signal could not be demodulated by the first, second or third UHF RFID tag 10a, 10b, 10c. The first, second, third and/or fourth UHF RFID transmitter could be adapted to demodulate a signal modulated with FSK modulation. A data exchange (dash-dotted line) between the UHF RFID transmitters 100a, 100b, 100c, 100d using an FSK modulation can take place. Data by means of FSK modulation cannot be demodulated by the UHF RFID tags 10a, 10b, 10c, 10d. Thus it can be assured that the communication between the UHF RFID transmitters 100a, 100b, 100c, 100d is not processed by the UHF RFID tags 10a, 10b, 10c, 10d. The UHF RFID transmitters 100a, 100b, 100c, 100d can, for example, transmit control signals among each other, for example for a stand-by function or a change of the carrier frequency. A central unit 110 monitors and controls the UHF RFID transmitters 100a, 100b, 100c, 100d additionally (dashed line).

From the description and the figures it can be seen that the invention contributes to improving the disturbance tolerance of a UHF RFID device. Disturbance signal received in the same frequency band as the desired data signal can be filtered out easily, with a small construction type and cost-effectively. Moreover, by the invention, the range of UHF RFID tags can be extended. Further, a communication can take place between UHF RFID transmitters.

The invention claimed is:

1. A method for producing an output bit stream for a first signal of a first carrier frequency by a security module, comprising the following steps in the security module:
   receiving an input signal comprising the first signal and a second signal of a second carrier frequency, wherein the first and second signal are received together,
   demodulating the input signal by a first nonlinear component, wherein the first nonlinear component outputs a first baseband signal;
   generating a first bit stream from the baseband signal;
   feeding the first bit stream to an output logic; and
   forming a mixed signal having the first signal at the first carrier frequency, the second signal at the second carrier frequency, and a mixed product at an intermediate frequency;
   wherein the steps of
   demodulating the mixed product by a second nonlinear component for outputting a second baseband signal for generating a second bit stream relating to the first signal in the mixed product; and
   producing the output bit stream for the first signal by the output logic, wherein the output logic selects either the first bit stream or the second bit stream as the output bit stream for the first signal.

2. The method according to claim 1, wherein the output logic combines the first bit stream with the second bit stream.

3. The method according to claim 1, wherein the mixed signal is filtered with the aid of a frequency filter, the frequency filter outputs the mixed product and the frequency filter is laid out for the intermediate frequency.

4. The method according to claim 1, wherein the first and/or second nonlinear component increases an amplitude of the input signal and/or has the function of a mixer and/or of a demodulator.

5. The method according to claim 1, wherein a first and/or second level-value adjusting unit adjusts the first and/or second bit stream on the basis of a first and/or second reference value.

6. The method according to claim 5, wherein the first and/or second level-value adjusting unit adjusts the first and/or second reference value to the amplitude of the first and/or second baseband signal.

7. The method according to claim 5, wherein the first and/or second reference value is adjusted in dependence on the mixed signal and/or the first signal and/or the second signal.

8. The method according to claim 1, wherein the first bit stream has a disturbance value during the reception of the second signal, wherein the output logic switches from the first bit stream to the second bit stream when the output logic detects the disturbance value.

9. The method according to claim 1, wherein the output logic comprises a sensor for analyzing the first and/or second bit stream.

10. The method according to claim 1, wherein the security module employs the second signal for supplying energy.

11. The method according to claim 1, wherein the security module comprises a receiving unit, wherein the carrier frequency of the first signal and of the second signal are disposed in the reception range of the receiving unit.

12. A security module comprising a receiving unit for receiving an input signal comprising a first signal of a first carrier frequency and a second signal of a second carrier frequency, a first nonlinear component and a first level-value adjusting unit, wherein the first nonlinear component is adapted to form a mixed signal from the first signal and the second signal with a first baseband signal, wherein the level-value adjusting unit is adapted to generate a first bit stream from the first baseband signal;
   wherein
   the security module comprises a first frequency filter, a second nonlinear component and an output logic, wherein the first frequency filter is adapted to filter a mixed product from the mixed signal; the second nonlinear component is adapted to demodulate the mixed product and to generate a second bit stream; and the output logic has an input for the first bit stream and an input for the second bit stream, and the output logic is adapted to switch between the first and the second bit stream and is adapted to form a bit stream of the first signal from the first and second bit stream.

13. The security module according to claim 12, wherein the first/second nonlinear component is adapted as a mixer, for increasing the amplitude of the input signal and/or of the mixed product, and/or for demodulating the first signal and/or the mixed product.

14. A method, carried out at a security module, for producing an output bit stream for a first signal of a first carrier frequency by a security module, comprising the following steps:
receiving an input signal comprising the first signal and a second signal of a second carrier frequency, wherein the first and second signals are received together,
demodulating the input signal by a first nonlinear component, wherein the first nonlinear component outputs a first baseband signal;
generating a first bit stream from the first baseband signal;
feeding the first bit stream to an output logic; and
forming a mixed signal having the first signal at the first carrier frequency, the second signal at the second carrier frequency, and a mixed product at an intermediate frequency;
demodulating the mixed product by a second nonlinear component for outputting a second baseband signal for generating a second bit stream relating to the first signal in the mixed product; and
producing the output bit stream for the first signal by the output logic, wherein the output logic selects either the first bit stream or the second bit stream as the output bit stream for the first signal.

15. A system for producing a bit stream of a first signal of a first carrier frequency of a transmitting/receiving device, wherein the system comprises a security module that includes the following:
a receiving unit configured to receive an input signal comprising the first signal and a second signal of a second carrier frequency, wherein the first and second signals are received together,
a demodulating unit configured to demodulate the input signal by a first nonlinear component, wherein the first nonlinear component outputs a first baseband signal;
a generating unit configured to generate a first bit stream from the first baseband signal;
a feeding unit configured to feed the first bit stream to an output logic; and
a forming unit configured to form a mixed signal having the first signal at the first carrier frequency, the second signal at the second carrier frequency, and a mixed product at an intermediate frequency;
the demodulating unit configured to demodulate the mixed product by a second nonlinear component for outputting a second baseband signal for generating a second bit stream relating to the first signal in the mixed product; and
a producing unit configured to produce the output bit stream for the first signal by the output logic, wherein the output logic selects either the first bit stream or the second bit stream as the output bit stream for the first signal.

* * * * *